(12) United States Patent
Wong

(10) Patent No.: US 6,480,422 B1
(45) Date of Patent: Nov. 12, 2002

(54) CONTACTLESS FLASH MEMORY WITH SHARED BURIED DIFFUSION BIT LINE ARCHITECTURE

(75) Inventor: Sau Ching Wong, Hillsborough, CA (US)

(73) Assignee: Multi Level Memory Technology, San Jose, CA (US)

( * ) Notice: Subject to any disclaimer, the term of this patent is extended or adjusted under 35 U.S.C. 154(b) by 0 days.

(21) Appl. No.: 09/882,136

(22) Filed: Jun. 14, 2001

(51) Int. Cl.[7] ............................................. G11C 16/04
(52) U.S. Cl. ............................ 365/185.28; 365/185.11; 365/185.16
(58) Field of Search ...................... 365/185.28, 185.16, 365/185.11, 230.03, 185.05, 185.33, 51

(56) References Cited

U.S. PATENT DOCUMENTS

| | | |
|---|---|---|
| 4,281,397 A | 7/1981 | Neal et al. |
| 4,930,105 A | 5/1990 | Matsumoto et al. |
| 5,095,344 A | 3/1992 | Harari |
| 5,117,389 A | 5/1992 | Yiu |
| 5,172,338 A | 12/1992 | Mehrotra et al. |
| 5,198,380 A | 3/1993 | Harari |
| 5,204,835 A | 4/1993 | Eitan |
| 5,245,570 A | 9/1993 | Fazio et al. |
| 5,268,861 A | 12/1993 | Hotta |
| 5,315,541 A | 5/1994 | Harari |
| 5,399,891 A | 3/1995 | Yiu et al. |
| 5,477,499 A | 12/1995 | Van Buskirk et al. |
| 5,495,440 A | 2/1996 | Asakura |
| 5,526,307 A | 6/1996 | Yiu et al. |
| 5,583,808 A | 12/1996 | Brahmbhatt |
| 5,621,697 A | 4/1997 | Weng et al. |
| 5,623,438 A | 4/1997 | Guritz et al. |
| 5,633,185 A | 5/1997 | Yiu et al. |
| 5,691,938 A | 11/1997 | Yiu et al. |
| 5,717,636 A | 2/1998 | Dallabora et al. |
| 5,822,242 A | 10/1998 | Chen |
| 5,837,584 A | 11/1998 | Lu et al. |
| 5,862,076 A | 1/1999 | Eitan |
| 5,875,128 A * | 2/1999 | Ishizuka ................. 365/185.05 |
| 5,909,405 A * | 6/1999 | Lee et al. ..................... 365/103 |
| 5,959,892 A | 9/1999 | Lin et al. |
| 5,969,977 A * | 10/1999 | Camerlenghi et al. . 365/185.11 |
| 6,009,013 A | 12/1999 | Van Houdt et al. |
| 6,037,226 A | 3/2000 | Ra |
| 6,084,794 A | 7/2000 | Lu et al. |
| 6,091,633 A | 7/2000 | Carnea et al. |
| 6,121,670 A | 9/2000 | Hisamune |
| 6,130,452 A | 10/2000 | Lu et al. |
| 6,134,156 A | 10/2000 | Eitan |
| 6,175,519 B1 | 1/2001 | Lu et al. |
| 6,256,231 B1 | 7/2001 | Lavi et al. |
| 6,285,574 B1 | 9/2001 | Eitan |

OTHER PUBLICATIONS

Woo et al., A Novel Memory Cell using Flash Array Contactless EPROM (FACE) Technology, IEDM 90, (1990), pp. 5.1.1–5.1.4.

* cited by examiner

*Primary Examiner*—David Lam
(74) *Attorney, Agent, or Firm*—David T. Millers

(57) ABSTRACT

A contactless Flash memory uses a bank architecture with bank select devices and/or source line contacts at both ends of each bank. During programming, bank select devices at both ends of the bank supply currents to the memory cell being programmed, and/or diffused source lines conduct currents in both directions away from the memory cell being programmed. The multiple current paths reduce the current in any portion of the diffused lines and thereby reduce voltage drops in the diffused lines during programming. Accordingly, banks can have longer diffused lines (e.g., with twice as many cells per column of a bank) and still employ small bank select devices. The longer bank columns and smaller bank select devices result in an overall decrease in integrated circuit area for bank select devices, even though each bank has two bank select devices per diffused bit line.

27 Claims, 9 Drawing Sheets

CONTACTLESS FLASH MEMORY WITH SHARED BURIED DIFFUSION BIT LINE ARCHITECTURE

BACKGROUND

A conventional flat-cell or contactless Flash memory array employs bit lines and source lines that are diffused into a silicon substrate to reduce the overhead for drain and source contacts. FIGS. 1A and 1B show conventional contactless Flash memory array arrangements such as described in U.S. Pat. Nos. 5,717,636 and 5,526,307, which are hereby incorporated by reference in their entirety. These contactless memories have global metal bit lines 180 that connect to bank select devices 170 and 175 in a number of banks. FIG. 1A shows a single bank 100, and FIG. 1B shows two banks 100A and 100B. In these memories, each metal bit line 180 connects via a pair of bank select devices 170 and 175 to two independent diffused bit lines 110 and 115 that share a diffused source line 120.

FIG. 1C conceptually illustrates the layout of a bank 100 in a conventional contactless Flash memory. In bank 100, n+ diffusion into a silicon substrate forms diffused bit lines 110 and 115 and diffused source lines 120. Polysilicon floating gates 130 (poly 1) overlie channel regions, which are between diffused bit lines 110 and diffused source lines 120. Polysilicon word lines 140 (poly 2) cross over portions of diffused bit lines 110 and diffused source lines 120 that form the drains and sources of memory cells and also overlie associated floating gates 130.

FIG. 1D shows a cross section along a word line 140 in bank 100. As shown in FIG. 1D, channel regions 117 in the silicon substrate separate drain regions of diffused bit lines 110 and 115 from source regions of diffused source lines 120. Floating gates 130 overlie respective channel regions 117, with a gate insulator (e.g., gate oxide layer) between floating gates 130 and underlying channel regions 117. Word lines 140 overlie floating gates 130 with an insulating layer between each word line 140 and the underlying floating gates 130 that are in a row corresponding to the word line.

Returning to FIG. 1C, diffused source lines 120 extend to ground lines 125 or a virtual ground structure (not shown) at one end of bank 100. Diffused bit lines 110 and 115 extend to respective bank select devices 170 and 175 at an end of bank 100 opposite ground lines 125.

Bank select devices 170 and 175 include transistors between respective diffused bit lines 110 and 115 and contacts to respective metal bit lines 180 that are typically part of a first metal layer. Generally, each metal bit line 180 extends over a number of banks and is connected to corresponding bank select devices 170 and 175 in each of the banks. Bank select lines 160 and 165 respectively control bank select devices 170 and 175 in bank 100 to determine whether diffused bit lines 110 or 115 in bank 100 are connected to respective metal bit lines 180. The architecture of bank 100 provides only one metal bit line 180 for each pair of diffused bit lines 110 and 115, and bank select signals on bank select lines 160 and 165 control whether metal bit lines 180 are electrically connected to even-numbered diffused bit lines 110 or odd-numbered diffused bit lines 115.

Another conventional architecture for contactless Flash memories is illustrated in FIG. 1E and described in U.S. Pat. No. 5,691,938, which is hereby incorporated by reference in it entirety. The memory of FIG. 1E includes one metal bit line 180 for each diffused bit line 110 and only requires a single bank select line 170 per metal bit line 180 in each bank.

FIG. 1F is a circuit diagram representing two banks 100A and 100B having the same structure as bank 100 of FIGS. 1C and 1D. As shown, diffused bit lines 110 provide a resistance R between each pair of adjacent memory cells 150 along the bit line and a parasitic capacitance C per memory cell 150. Similarly, each source line 120 has resistance R and parasitic capacitance C associated with each section of the source line 120 between memory cells 150.

A programming operation for a selected memory cell in bank 100 uses channel hot electron injection to change the charge on the floating gate 130 in the selected memory cell. The programming operation generally applies a positive programming voltage Vw to a selected metal line 180 associated with the selected memory cell and grounds diffused source lines 120 via ground line 125 in the selected bank. Activation of the selection signal on the bank select line 160 or 165 in the bank containing the selected memory cell applies the programming voltage Vw from the selected metal bit line 180 to an end of a selected diffused bit line 110. An opposite end of the source line 120 for the selected memory cell is grounded.

The drain-to-source voltage resulting across the selected memory cell during programming depends the total impedance along of the diffused bit line 110 or 115 and source line 120 between the points at which voltage Vw and ground are applied to the diffused lines. Contactless Flash memory designs generally limit the lengths of diffused bit and source lines 110 and 120 to control the total impedance and voltage (or iR) drop during programming. Additionally, bank select devices 170 and 175 must have a size sufficient to provide the current required for rapid programming despite the impedance in the diffused bit and source lines 110 and 120. Current contactless memories typically have banks with 32 to 128 memory cells 150 per diffused bit line 110, and bank select devices can occupy a substantial percentage of the area of a bank.

A contactless Flash memory architecture that reduces voltage drop that the impedance causes in diffused lines 110 and 120 during programming could permit larger banks with a larger number of memory cells and reduce the size or amount of overhead circuitry associated with the bank select devices in the contactless Flash memory.

SUMMARY

In accordance with an aspect of the invention, a contactless Flash memory architecture provides bank select devices at both ends of each diffused bit line. The bank select devices simultaneously share the current load required for programming and can thus be made smaller than bank select devices in memory architectures having bank select devices at only one end of each diffused bit line. In one embodiment, of the invention, the number of memory cells in per column in a bank can be doubled if the bank includes bank select devices on opposite ends of each diffused bit line. Each of these bank select devices can be smaller than a bank select device used in an architecture having bank select devices at only one end of a bank.

In different embodiments, source or virtual ground contacts for diffused source lines in a bank can be located in the center of a bank, at one end of a bank, or at both ends of the bank.

One specific embodiment of the invention has a bank of memory cells that includes: a diffused bit line that is continuous between a first end and a second end in a substrate; a diffused source line in the substrate; a column of memory cells such as Flash memory cells that are between the diffused bit and source lines; an overlying bit line associated with the diffused bit line; a first bank select device; and a second bank select device. The first bank select device is between the bit line and the diffused bit line, and when activated, the first bank select device conducts from the overlying bit line a current that enters the first end of the diffused bit line. Similarly, the second bank select device is between the bit line and the diffused bit line, and when activated, the second bank select device conducts from the bit line a current that enters the diffused bit line at the second end of the diffused bit line.

Generally, each of the first and second bank select devices has a size such that current that flows through the bank select device during programming is insufficient by itself to program the memory cell in a required programming time, but the combination of the currents flowing through the first and second bank select devices during programming is sufficient to program the memory cell in the required programming time.

The diffused source line can be connected to an overlying virtual ground line. In alternative embodiments, the diffused source line has two contacts, one contact at each end of the diffused source line, or a single contact in a central portion of the bank.

The contacts from overlying bit lines to the bank select devices can either be near source line contacts or staggered with a column of memory cells separating each contact to bank select devices and the nearest contact to a diffused source line. In one embodiment, the bank includes a second diffused bit line and a second column of memory cells formed in and on the substrate with portions of the second diffused bit line and the diffused source line forming drain/source regions of the memory cells in the second column. A third bank select device when activated conducts a current that enters the first end of the second diffused bit line, and a fourth bank select device when activated conducts a current that enters the second end of the second diffused bit line. One contact structure has a first contact connecting the bit line to the first and third bank select devices and a second contact connecting the bit line to the second and fourth bank select devices. In an alternative contact structure, the third bank select device is between a second bit line and the second diffused bit line and when activated conducts the current that enters the first end of the second diffused bit line, and the fourth bank select device is between the second bit line and the second diffused bit line and when activated conducts the current that enters the second end of the second diffused bit line.

Another embodiment of the invention is programming method for a memory cell in a contactless Flash memory. The method includes: activating a word line associated with the memory cell to enable a current flow through the memory cell from a diffused bit line to a diffused source line; and simultaneously generating a first programming current that flows in a first direction along the diffused bit line to the memory cell and a second programming current that flows in a second direction along the diffused bit line to the memory cell, the second direction being opposite the first direction. The first and second programming currents can be simultaneously generated by biasing an overlying bit line to a programming voltage and simultaneously activating a first bank select device that is between the overlying bit line and a first end of the diffused bit line and a second bank select device that is between the overlying bit line and a second end of the diffused bit line. Additionally, both ends of the diffused source line can be grounded so that current flows in the diffused source line in both directions away from the memory cell.

Another embodiment of the invention is a method for reading a memory cell in a contactless memory. The method includes: activating a word line associated with the memory cell to a level that enable a current flow through the memory cell from a diffused bit line to a diffused source line if the memory cell is in a first threshold voltage state but does not enable current flow if the memory cell is in a second threshold voltage state; connecting a metal bit line to a first end and a second end of the diffused bit line; grounding the diffused source line; and sensing whether a significant current flows through the metal bit line. Grounding the diffused source line can be via a contact in a central portion of a bank containing the memory cell. Alternatively, grounding the diffused source line includes connecting opposite ends of the diffused source line to ground.

BRIEF DESCRIPTION OF THE DRAWINGS

Use of the same reference symbols in different figures indicates similar or identical items.

DETAILED DESCRIPTION

In accordance with an aspect of the invention, a contactless Flash memory has bank select devices at both ends of a bank. The bank select devices share current loads required for programming of memory cells in the bank. Additionally, since current flows through multiple paths, the current through any section of the diffused bit lines is reduced accordingly, which reduces the voltage drop arising from the effective resistances of the diffused lines. Accordingly, a memory bank in accordance with the invention can have twice as many or more memory cells per column and still use bank select devices that are smaller than the bank select devices in a conventional contactless Flash memories having bank select devices at only one end of each bank. The smaller bank select devices decrease the required integrated circuit area required for overhead and thus reduce the size and manufacturing cost of a contactless Flash memory in accordance with the invention.

The invention further provides a simple, practical, and effective-alternative to approaches that aim at reducing the intrinsic diffused-line resistances, instead of reducing the effective diffused-line resistances as in the present invention. Processes that reduce diffused line resistance are typically costly and complicated to implement, but embodiments of the present invention could be used in conjunction with these other approaches for additional reduction of the effective resistance of diffused bit and source lines.

Figure 2:
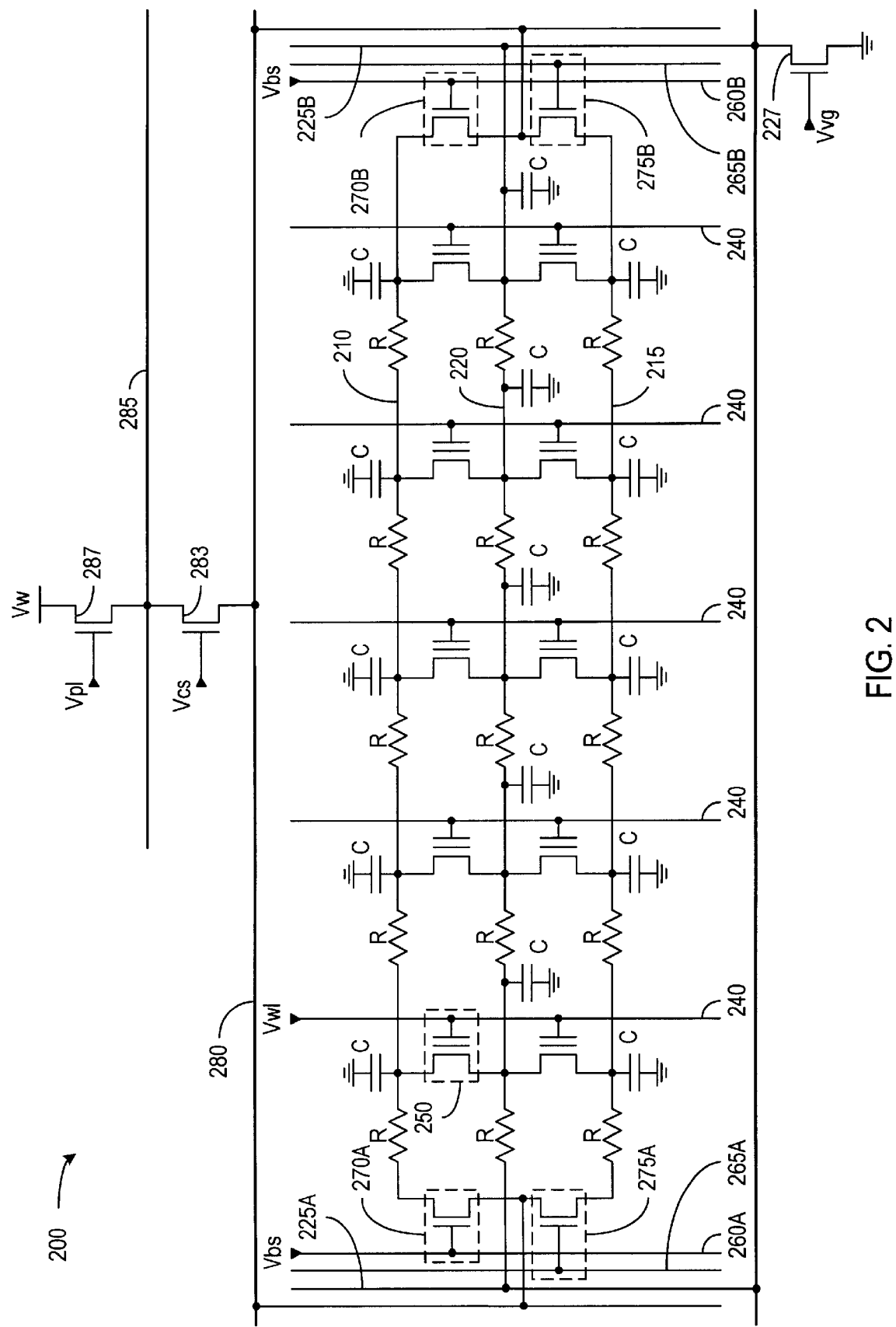
FIG. 2 is a circuit diagram of a contactless memory bank in accordance with an embodiment of the invention having bank select devices and contacts to diffused source lines at both ends of the bank.

FIG. 2 shows a bank 200 in accordance with an embodiment of the invention. Bank 200 includes diffused bit lines 210 and 215 and a diffused source line 220, which are in a semiconductor substrate. Conventional integrated circuit fabrication techniques can implant or otherwise form diffused lines 210, 215, and 220 in or on the semiconductor substrate. Resistors and capacitors shown in FIG. 2 represent the parasitic resistance and capacitance associated with diffused lines 210, 215, and 220.

FIG. 2 shows only five word lines 240, two diffused bit lines 210 and 215, and the source line 220 associated with an adjacent pair of columns in bank 200. An actual bank would typically include about 64 to 256 word lines (or twice as many rows as in a conventional bank of a contactless memory) and hundreds or thousands of columns of memory cells 250.

Figure 1A:
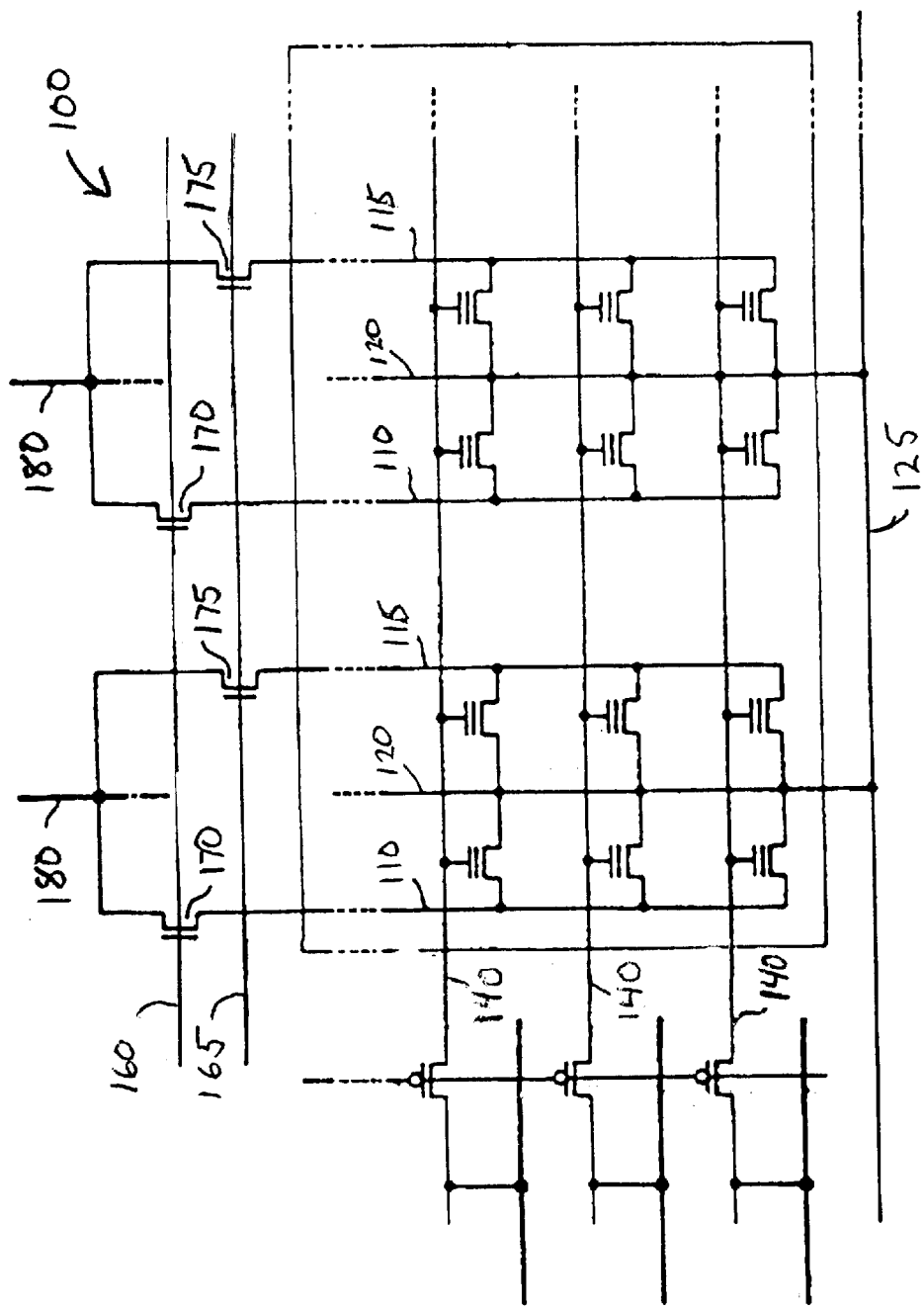
FIGS. 1A, 1B, 1E and 1F are circuit diagrams of banks in conventional contactless Flash memories.
Figure 1B:
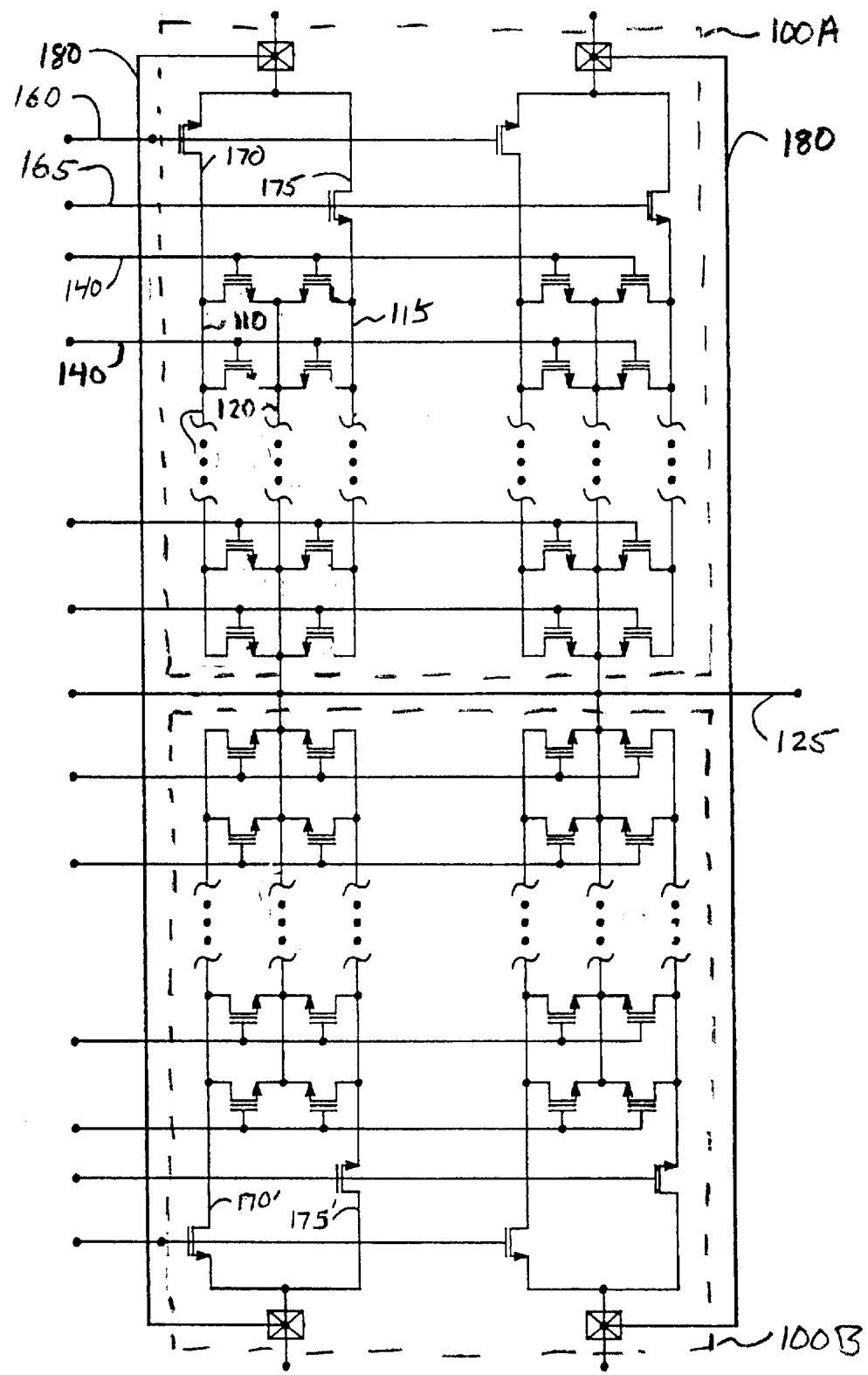
Figure 1C:
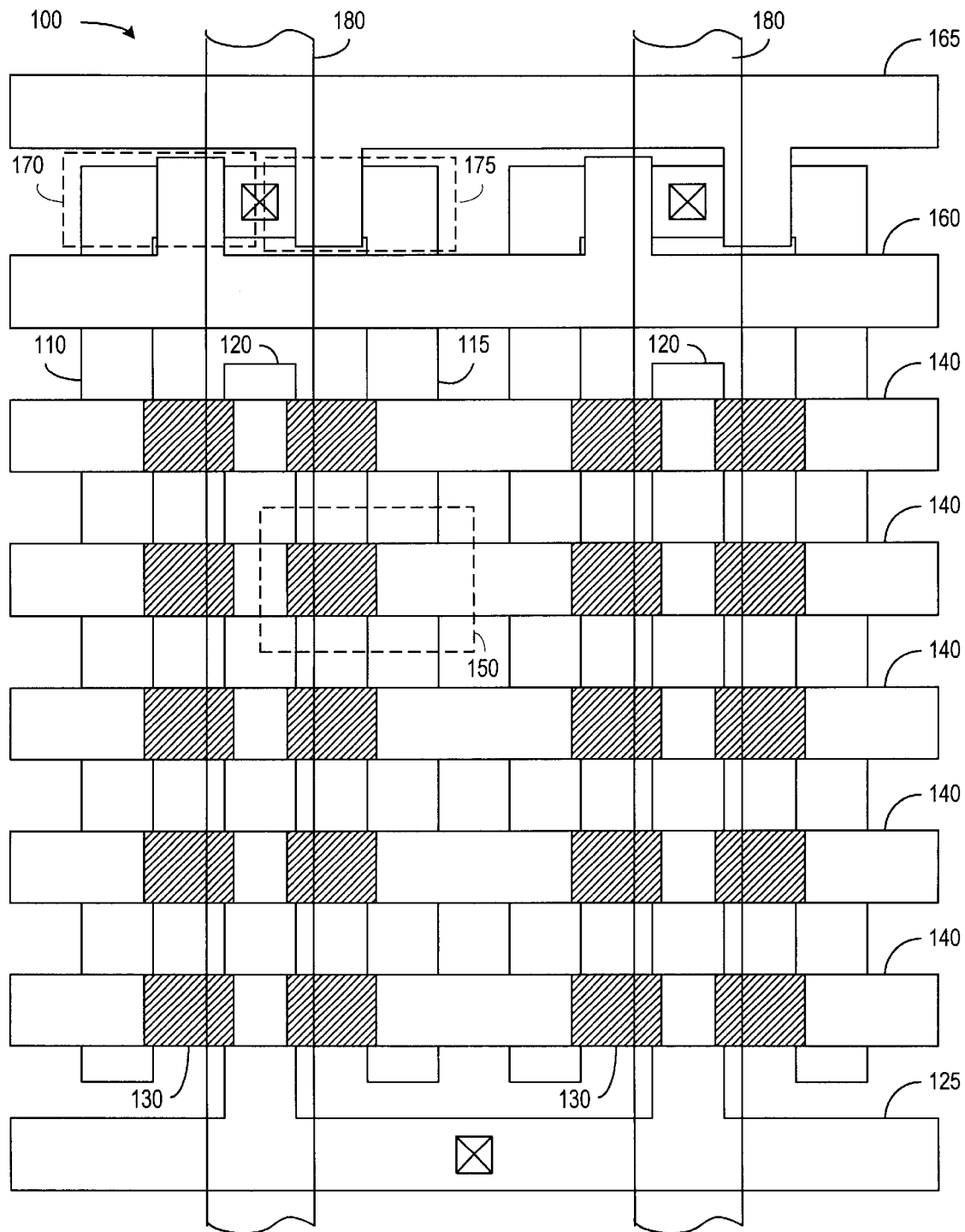
FIGS. 1C and 1D respectively show a layout and a cross-section of a bank in a conventional contactless Flash memory.
Figure 1D:
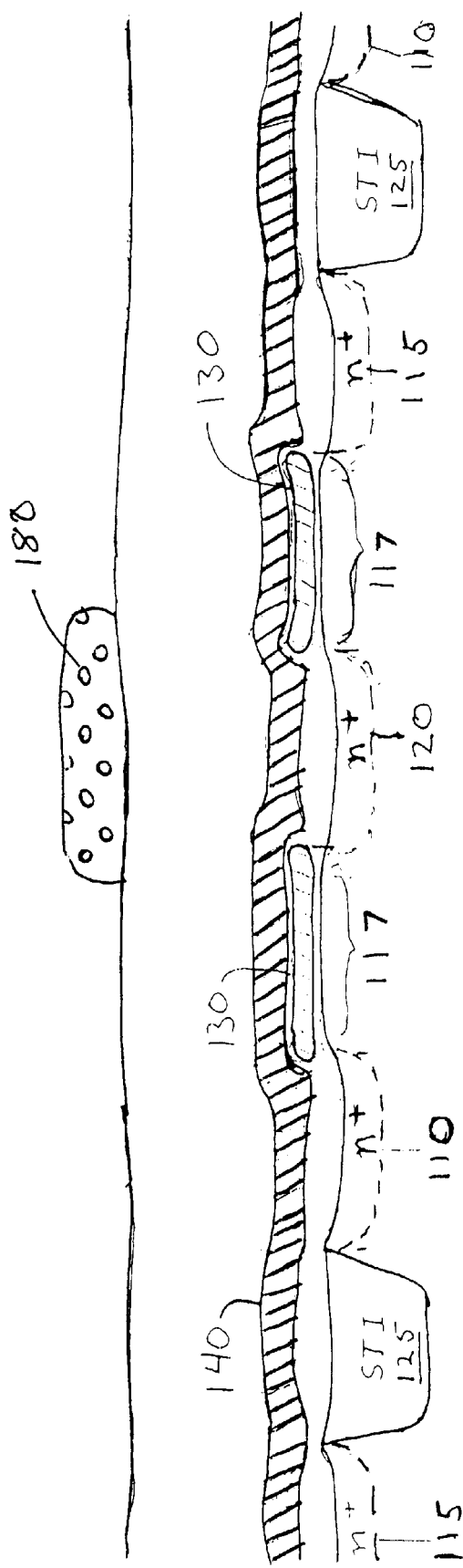
Figure 1E:
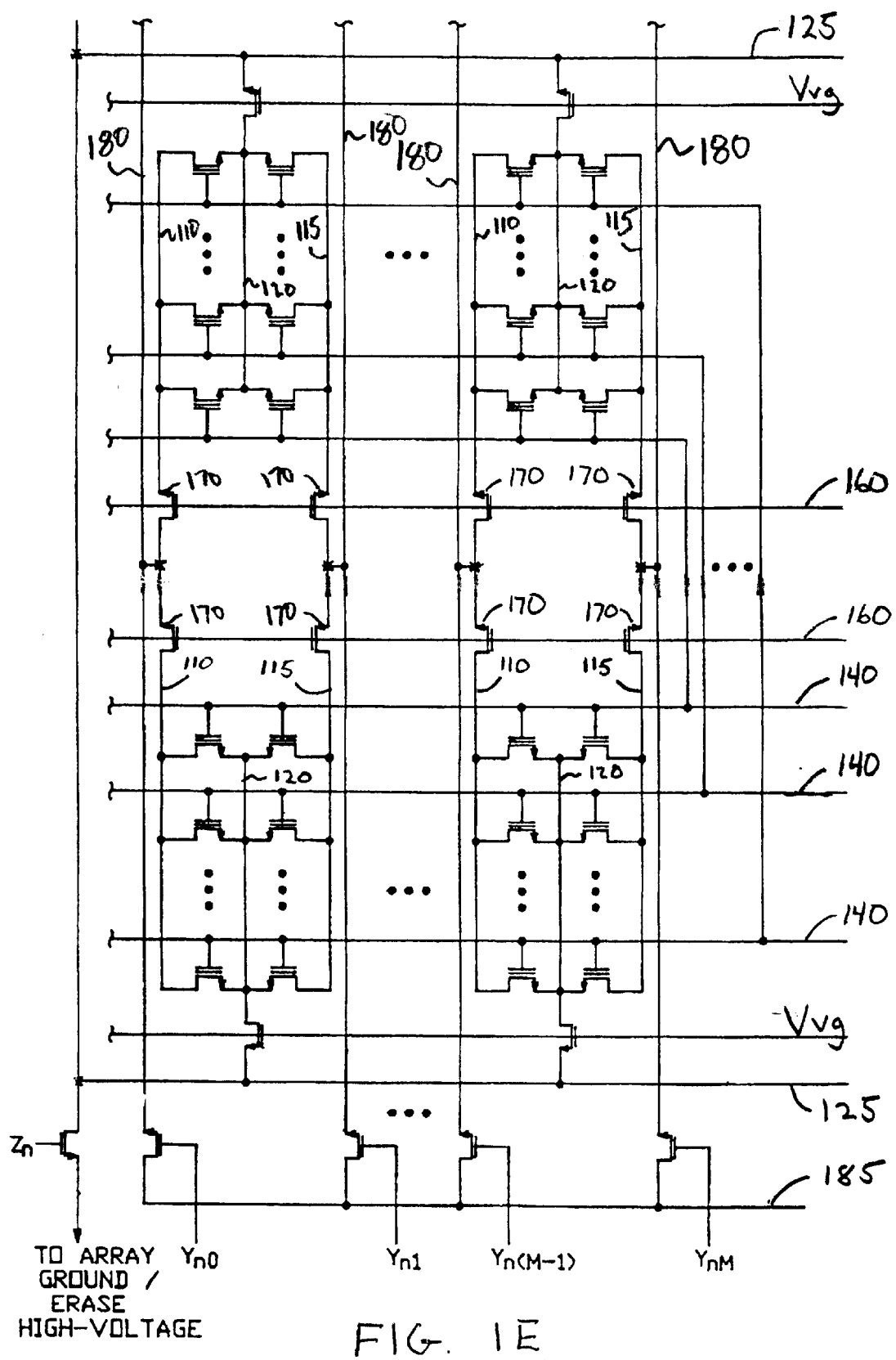

Memory cells in bank 200 can have a conventional architecture and construction such as illustrated in FIGS. 1C and 1D or any of other construct such as those described in co-owned U.S. patent Application Ser. No. 09/839,973, filed Apr. 20, 2001, which is hereby incorporated by reference in its entirety. Generally, each memory cell includes a channel region between portions of an associated bit line 210 or 215 and source line 220 that respectively form drain and source regions of the memory cell. A floating gate, typically formed from a first polysilicon layer, overlies the channel region with a gate insulator between the floating gate and the channel region. A word line 240, typically formed from a second polysilicon layer, crosses over the floating gate and forms a control gate of the memory cell.

Unlike prior contactless Flash memories, diffused bit lines 210 and 215 and diffused source line 220 have both ends connected to programming circuits. In particular, bank select devices 270A and 270B are at opposite ends of diffused bit line 210 and operate to connect diffused bit line 210 to a metal bit line 280 in response to activation of a bank select signal on bank select lines 260A and 260B. Similarly, bank select device 275A and 275B are at opposite ends of diffused bit line 215 and connect diffused bit line 215 to metal bit line 280 in response to a bank select signal on bank select lines 265A and 265B. Diffused source line 220 connects to virtual ground lines 225A and 225B, which are at opposite ends of bank 200.

The connections at both ends of diffused lines 210, 215, and 220 provide multiple current paths when accessing (programming, reading, or erasing) a memory cell 250 and thereby reduce the voltage drop through diffused lines 210, 215, and 220. Generally, programming operations required more current than read or verify operations and are more affected by voltage or iR drop in diffused lines 210, 215, and 220 than are other access operations. Accordingly, the greatest performance improvements result from reducing the voltage drop during programming. The lower voltage drop permits use of longer diffused lines (i.e., more memory cells per column in the bank) or use of a lower programming voltage Vw, which simplifies design of high voltage charge pumps that supply high programming voltages and currents. Lowering the programming voltage is particularly important when the supply voltage Vcc is less than 3 volts. The RC time constant, or RC delay, effect during programming is typically not a limitation.

FIG. 2 also illustrates programming voltages or signals applied to bank 200 to program a selected memory cell 250 via channel hot electron injection. For programming memory cell 250, decoding circuits (not shown) activate bank select signals on bank select lines 260A and 260B or 265A and 265B according to a row address, which identifies bank 200 as being selected, and the least significant bit of a column address signal, which selects either bank select lines 260A and 260B or bank select lines 265A and 265B to access an odd or even-number column memory cells. For the selected memory cell 250 illustrated in FIG. 2, the bank select signal on bank select lines 260A and 260B is activated to voltage Vbs, which is typically about 10 to 12 volts. In response, bank select devices 270A and 270B connect metal bit line 280 to diffused bit line 210.

Metal bit line 280 is biased for programming from a voltage source at voltage Vw, which is typically about 5 to 6 V. In FIG. 2, the biasing occurs through a program select transistor 287 connected between the voltage source and an I/O line 285, and a column select transistor 283 that is between I/O line 285 and metal bit line 280. Control voltages Vpl and Vcs for transistors 287 and 283 are typically about 10 to 12 volts during programming.

Virtual ground lines 225A and 225B are near ground voltage as a result of activation of virtual ground device 227 during programming, read, and verify operations.

Row decoders and drivers (not shown) drive the word line 240 that is connected to selected memory cell 250 to a voltage Vwl, which is typically about 9 to 10 volts. Accordingly, the selected memory cell turns on and conducts a current from diffused bit line 210 to diffused source line 220. The programming current flows to selected memory cell 250 from both bank select devices 270A and 270B and flows from selected memory cell 250 to virtual ground lines 225A and 225B via source line contacts at both ends of diffused source line 220.

A concern in bank 200 is the proximity of source line and bit line contacts. In particular, the area at the left end of bank 200 in FIG. 2 includes a contact from metal bit line 280 to drain regions of bank select devices 270A and 275A and a contact from a virtual ground line 225A to diffused source line 220. Similarly, the area at the right end of bank 200 in FIG. 2 includes a contact from metal bit line 280 to drain regions of bank select devices 270B and 275B and a contact from a virtual ground line 225B to diffused source line 220. This contact structure is confined to the width of two columns of memory cells, which creates congestion that can complicate layout of contact structures in the integrated circuit.

Figure 3:
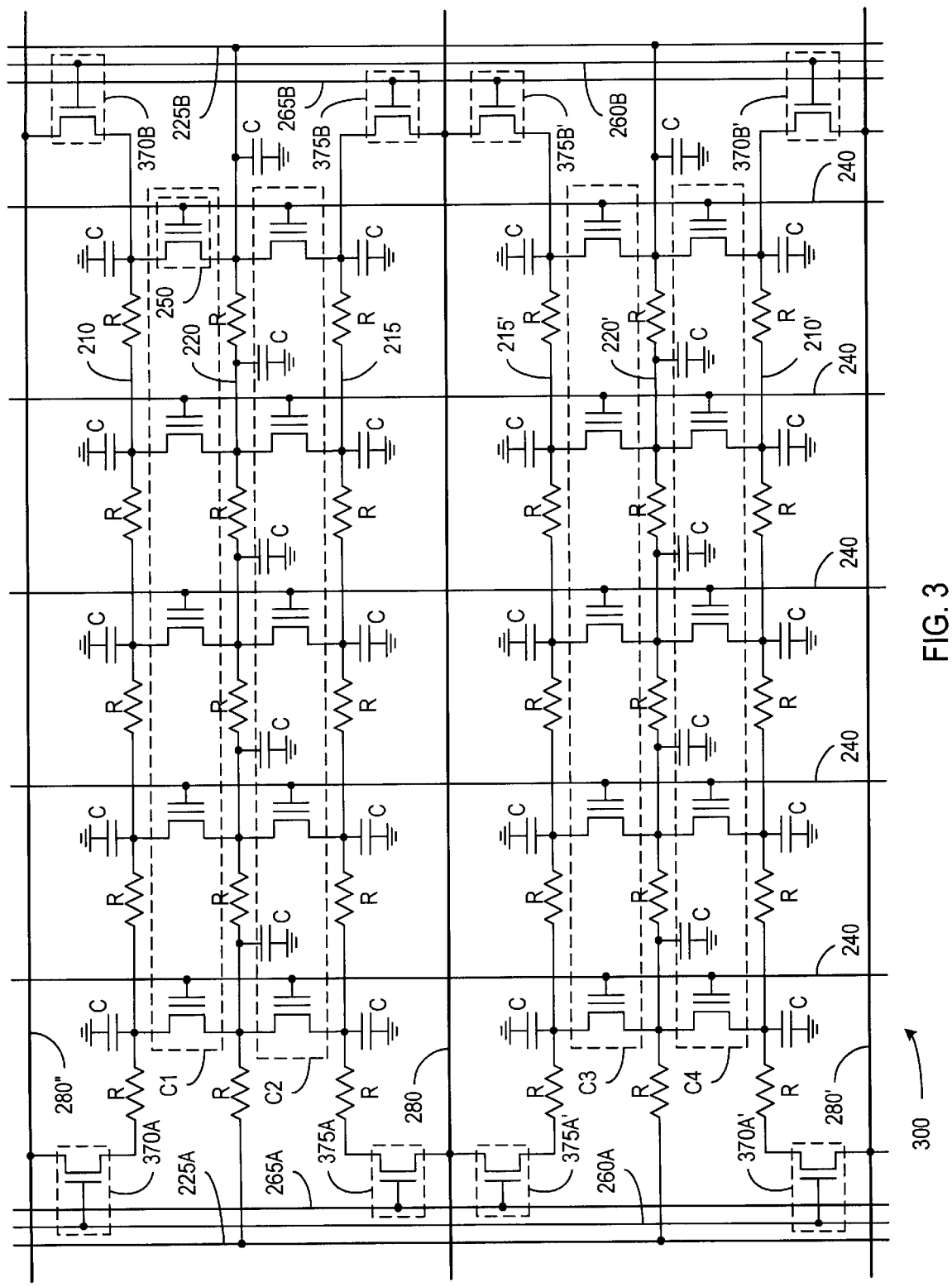
FIG. 3 is a circuit diagram of a contactless memory bank in accordance with an embodiment of the invention having staggered bank select devices and source line contacts at both ends of the bank.

FIG. 3 shows a portion of a bank 300 that increases the separation between contacts by staggering the contacts of diffused source lines and contacts of bank select devices. More specifically, the illustrated portion of bank 300 includes four columns C1, C2, C3, and C4 of memory cells. Columns C1, C2, C3, and C4 have respective diffused bit lines 210, 215, 210', and 215', and each pair of columns C1 and C2 or C3 and C4 shares a diffused source line 220 or 220'. In accordance with an aspect of the invention, bank select devices 375A and 375A' for columns C2 and C3, which do not share a diffused column line, share a contact to a corresponding metal line 280. Columns C1 and C4 are accessed through other metal bit lines 280, more specifically metal bit lines 280" and 280', respectively.

With the configuration of FIG. 3, contacts from metal bit line 280 to bank select devices 375A, 375A', 375B, and 375B' are between columns C2 and C3, but contacts from virtual ground lines to diffused source lines 220 and 220' are respectively between columns C1 and C2 and between columns C3 and C4. This increases the separation between contacts for the metal bit lines 280 and contacts for virtual ground lines 225A and 225B and simplifies layout of bank 300. Column decode circuitry (not shown) that selects a metal line 280 can easily be adapted according to the assignment of diffused bit lines 210 and 215 to the metal lines used in FIG. 2 or 3.

Figure 4:
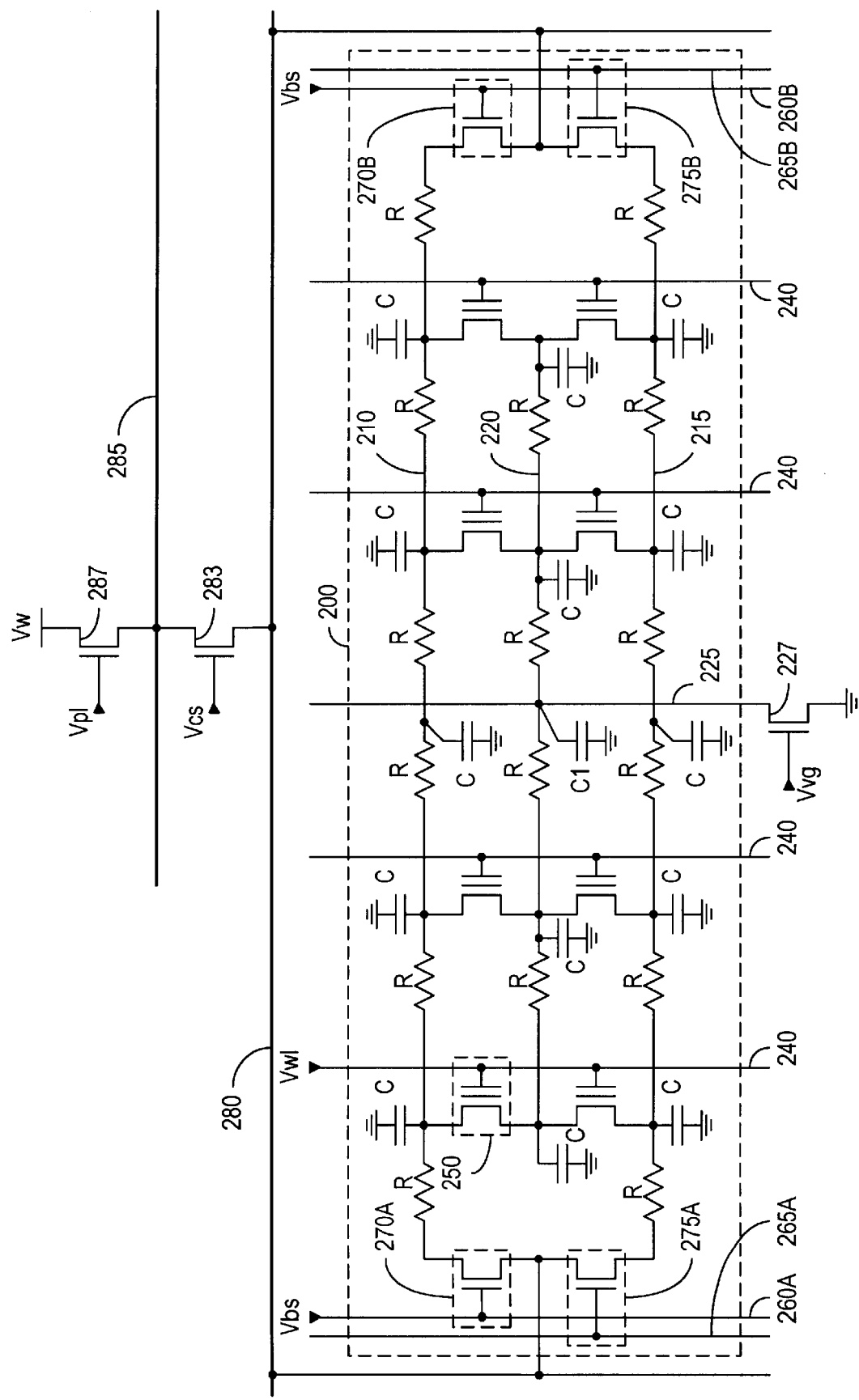
FIG. 4 is a circuit diagram of a contactless memory bank in accordance with an embodiment of the invention having bank select devices at both ends of the bank and source line contacts at the center of the bank.

FIG. 4 illustrates an embodiment of the invention that includes bank select devices at opposite ends of each diffused bit line and one contact per diffused source line. In FIG. 4, bank select devices 270A and 270B connect opposite ends of diffused bit line 210 to metal bit line 280 associated with diffused bit lines 210 and 215, and bank select devices 275A and 275B connect opposite ends of diffused bit line 215 to the associated metal bit line 280. The contact from virtual ground line 225 contacts diffused source line 220 at or near the midpoint of diffused source line 220. The virtual ground contact is thus separated from the contacts to metal bit line 280, which reduces the structural congestion at the ends of bank 300 and thus can simplify the layout of the contact structures.

Figure 1F:
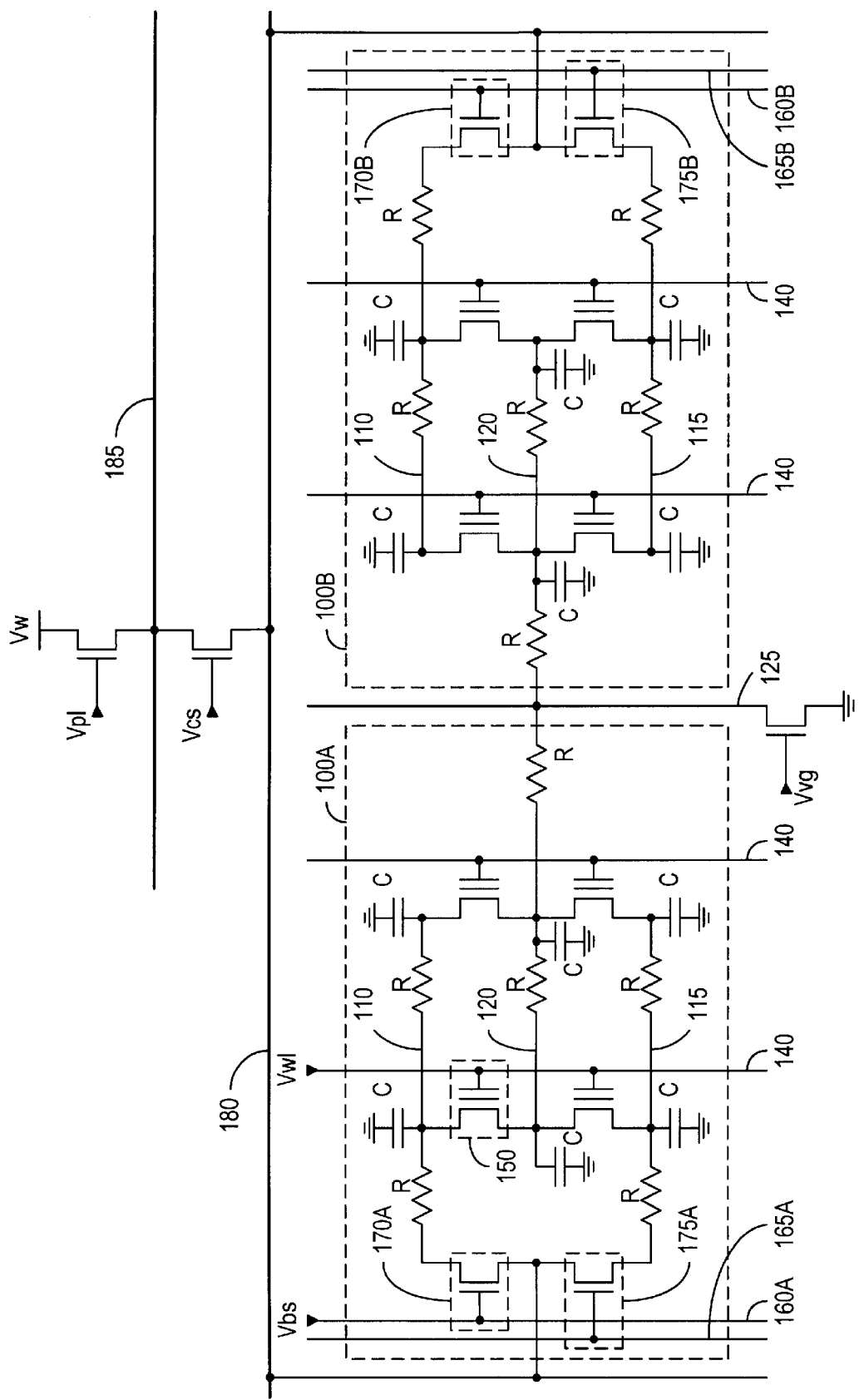

As described above, having bit line contacts and/or source line contacts at both ends of a bank provides multiple current paths to a memory cell being programmed in the bank and reduces the programming current through the bank select devices, diffused bit lines, and diffused source lines. Table 1 summarizes the results of a SPICE simulation of the programming performance of a conventional bank as illustrated in FIG. 1F, a bank having a central source contact and bit line contacts at both ends as illustrated in FIG. 4, and a bank having source and bit line contacts at both ends as illustrated in FIG. 3.

For the simulation, the conventional bank has 64 memory cells per column and each length of diffused bit line or diffused source line associated with a memory cell has a resistance R and capacitance C of about 200Ω and 0.02 pf respectively. The banks in accordance with the embodiments of FIGS. 3 and 4 have 128 memory cells per column and the same resistance R and capacitance C per length of diffused bit or source line. In Table 1, cell #1 is the cell nearest to the bank select in the conventional bank and nearest to one of the bank selects in banks in accordance with the present invention. The banks having bank selects at both ends are symmetric, and the performance of cells #65 to #128 are the same as the performance of cells #64 to #1.

For each of the simulations, programming voltage Vw is 6 volts. The voltage Vwl on the selected word line is 9 volts. Program select voltage Vpl, column select voltage Vcs, and the bank select voltage Vbs are 10 volts. The signal Vvg activating the virtual ground device is about 3.0 volts.

The transistor 227 for the virtual ground lines is an N-channel MOS transistor with a channel width of about 40 $\mu$m and a channel length of about 0.6 $\mu$m. The program select transistor 287 is an N-channel MOS transistor with a channel width of about 20 $\mu$m and a channel length of about 0.6 $\mu$m, and the column select transistor 283 is an N-channel MOS transistor with a channel width of about 10 $\mu$m and a channel length of about 0.6 $\mu$m.

TABLE 1

Programming Currents and Voltages at Memory Cells

| Bank Select Size (W/L) | Cell #1 Cell Current ($\mu$A) | Vds (volts) | Cell #32 Cell Current ($\mu$A) | Vds (volts) | Cell #64 Cell Current ($\mu$A) | Vds (volts) |
|---|---|---|---|---|---|---|
| Conventional Bank | | | | | | |
| 5.0/0.6 | 430 | 4.9 | 430 | 4.9 | 430 | 4.9 |
| 2.5/0.6 | 380 | 4.6 | 380 | 4.6 | 380 | 4.6 |
| Central Source Contact | | | | | | |
| 3.5/06 | 430 | 4.9 | 440 | 5.0 | 460 | 5.2 |
| 2.5/0.6 | 420 | 4.8 | 430 | 4.9 | 450 | 5.1 |
| Dual Source & Bit Line Contacts | | | | | | |
| 3.5/0.6 | 480 | 5.3 | 450 | 5.1 | 440 | 5.0 |
| 2.5/0.6 | 450 | 5.1 | 440 | 5.0 | 430 | 4.9 |

For the conventional contactless Flash memory bank, N-channel bank select devices having a channel width of 5.0 $\mu$m and a channel length of 0.6 $\mu$m, provide a programming current that is nearly independent of the position of the selected memory cell along the diffused lines. A minimum programming current of 430 $\mu$A, which occurs for memory cell #64, is at a level sufficient to provide a desired programming speed for Flash memory cells currently in use. However, if the channel width of each bank select device is reduced by 50%, the minimum programming current drops to 380 $\mu$A, and undesirably slows programming significantly.

In the embodiment of the invention illustrated in FIG. 4, bank select devices having a channel width of 3.5 $\mu$m (i.e., about 70% of the channel width of bank select devices in the conventional bank) still provide a minimum programming current of 430 $\mu$A. For the embodiment of the invention illustrated in FIG. 2 or 3, bank select devices having a channel width of 2.5 $\mu$m (i.e., about 50% of the channel width of bank select devices in the conventional bank) still provide a minimum programming current of 430 $\mu$A. Accordingly, the simulation of Table 1 indicates that embodiments of the invention can use bank select devices that are significantly smaller than those required for a conventional bank having bank select devices at only one end of the bank.

The simulation is for 128 memory cells per diffused bit line for the embodiments of FIGS. 2, 3, and 4 but only 64 memory cells per diffused bit line for the conventional bank of FIG. 1F. For the conventional bank architecture of FIG. 1F, 128 memory cells in a column require two banks and would have two bank select devices, the same number of bank select devices for 128 memory cells in the simulated embodiments of the invention. Accordingly, the simulations of banks in accordance with the invention have the same number of bank select devices as the simulation of the conventional bank architecture, but the banks in accordance with the present invention significantly reduce (e.g., cut in half) the required size of the bank select devices and provides an overall reduction in the integrated circuit size.

A bank according to FIG. 2, 3, or 4 with 64 memory cells per diffused bit line would have twice as many bank select devices as the bank according to FIG. 1F with 64 memory cells per diffused bit line. However, the effective resistance of the diffused lines for 64 memory cells is about one half of the effective resistance of diffused lines in the simulation in Table 1, of the bank in accordance with FIG. 2.

Accordingly, the bank select devices can be further reduced from 50% to as little as 25% of the size that the conventional architecture requires. Accordingly, when comparing banks of the same size, the: bank architecture of FIG. 2 can reduce overall overhead for bank select devices because even though the bank architecture of FIG. 2 has twice as many bank select devices per bank, the bank select devices can be less than half of the conventional size.

Table 1 illustrates that the programming current varies less with memory cell position in the conventional bank. However, the uniformity is not a concern in a typical programming process that uses verify operations to check the threshold voltage state of a memory cell being programmed and stops programming upon reaching a target threshold voltage. Higher programming currents for memory cells near a bank select in the embodiments of FIG. 2 or 3 will cause those memory cells to program faster, which improves the average programming performance and reduces program disturbs accordingly.

Use of bank select and/or source contacts at both ends of diffused but and source lines in a bank of a contactless memory also provides improvement during read and verify operations. For example, during a read or verify operation, a word line is activated to a level between the threshold voltages states ("0" and "1" states) for a read operation or to a level associated with the programmed state for a verify operation. A selected metal bit line is charged to a read voltage (typically about 1.0 to 1.5 volts for a 3-volt supply voltage Vcc), and the virtual ground lines are grounded. Diffused bit and source lines are connected at both ends of a bank to the metal bit line and virtual ground lines, respectively. If the threshold voltage of the selected memory cell is less than the word line voltage, a bit line current flows through the selected memory cell, and a sense amplifier (not shown) can sense the bit line current, or a change in the bit line voltage. In accordance with the present invention, the bit line current can flow to the selected memory cell from both directions on the diffused bit line and can flow away from the selected memory cell in both directions on the diffused source line. The reduction in effective resistances permits fast current or voltage sensing because of reduced RC delay and voltage (iR) drop effects.

Although the invention has been described with reference to particular embodiments, the description is only an example of the invention's application and should not be taken as a limitation. For example, although the above describes specific embodiments that were used in SPICE simulations, those embodiments are merely exemplary or illustrative and the utility of the invention is not limited to the specific memory cell structure or technology, programming mechanisms, voltages, resistances, and transistor sizes used in the examples. Various adaptations and combinations of features of the embodiments disclosed are within the scope of the invention as defined by the following claims.

I claim:

1. An integrated circuit comprising:
    a bit line; and
    a bank of memory cells, wherein the bank of memory cells comprises:
    a diffused bit line that is continuous between a first end and a second end in a substrate;
    a diffused source line in the substrate;
    a plurality of memory cells formed in and on the substrate, wherein portions of the diffused bit line and the diffused source line form drain/source regions of the memory cells;
    a first bank select device that is between the bit line and the first end of the diffused bit line, wherein when activated, the first bank select device conducts a current between the bit line and the first end of the diffused bit line; and
    a second bank select device that is between the bit line and the second end of the diffused bit line, wherein when activated, the second bank select device conducts a current between the bit line and the second end of the diffused bit line.

2. The integrated circuit of claim 1, wherein each of the memory cells comprises a Flash memory cell.

3. The integrated circuit of claim 1, wherein the bank further comprises:
    a first contact to a first end of the diffused source line; and
    a second contact to a second end of the diffused source line, wherein the diffused source line is continuous in the substrate between the first and second ends of the diffused source line.

4. The integrated circuit of claim 3, further comprising a virtual ground structure, wherein the first and second contacts electrically connect the diffused source line to the virtual ground structure.

5. The integrated circuit of claim 1, wherein the bank further comprises a contact to the diffused source line, the contact being in a midpoint of the diffused source line.

6. The integrated circuit of claim 5, further comprising a virtual ground structure, wherein the contact electrically connects the diffused source line to the virtual ground structure.

7. The integrated circuit of claim 1, wherein the bank further comprises:
    a second diffused bit line that is continuous between a first end and a second end in the substrate;
    a second plurality of memory cells formed in and on the substrate, wherein portions of the second diffused bit line and the diffused source line form drain/source regions of the memory cells in the second plurality;
    a third bank select device that when activated, conducts a current that enters the first end of the second diffused bit line; and
    a fourth bank select device that when activated, conducts a current that enters the second end of the second diffused bit line.

8. The integrated circuit of claim 7, further comprising a second bit line, wherein:
    the third bank select device is between the second bit line and the second diffused bit line, and when activated, the third bank select device conducts from the second bit line, the current that enters the first end of the second diffused bit line; and
    the fourth bank select device is between the second bit line and the second diffused bit line, and when activated, the fourth bank select device conducts from the second bit line, the current that enters the second end of the second diffused bit line.

9. The integrated circuit of claim 1, wherein the bit line is a metal line.

10. The integrated circuit of claim 1, further comprising one or more banks of memory cells, wherein each bank comprises:
    a diffused bit line that is continuous between a first end and a second end in the substrate;
    a diffused source line in the substrate;
    a plurality of memory cells formed in and on the substrate, wherein portions of the diffused bit line and the diffused source line form drain/source regions of the memory cells;

a first bank select device that is between the bit line and the diffused bit line, wherein when activated, the first bank select device conducts a current between the bit line and the first end of the diffused bit line; and a second bank select device that is between the bit line and the diffused bit line, wherein when activated, the second bank select device conducts a current between the bit line and the second end of the diffused bit line.

11. The integrated circuit of claim 1, wherein the first bank select device and the second bank select device are connected for simultaneous activation during an access of one of the memory cells.

12. An integrated circuit comprising:

a bit line; and a bank of memory cells, wherein the bank of memory cells comprises:

a diffused bit line that is continuous between a first end and a second end in a substrate;

a diffused source line in the substrate;

a plurality of memory cells formed in an on the substrate, wherein portions of the diffused bit line and the diffused source line form drain/source regions of the memory cells;

a first bank select device that is between the bit line and the diffused bit line, wherein when activated, the first bank select conduct conducts a first current between the bit line and the first end of the diffused bit line; and a second bank select device that is between the bit line and the diffused bit line, wherein when activated, the second bank select device conducts a second current between the bit line and the second end of the diffused bit line, wherein each of the first and second bank select devices has a size such that during programming, each of the first current and the second current that flows is insufficient by itself to program the memory cell in a required programming time, and a combination of the first and second currents flowing through the first and second bank select devices during programming is sufficient to program the memory cell in the required programming time.

13. The integrated circuit of claim 12, wherein the first and second bank select devices are connected for simultaneous activation during an access of one of the plurality of memory cells.

14. An integrated circuit comprising:

a bit line; end a bank of memory cells, wherein the bank of memory cells comprises:

a first diffused bit line that is continuous between a first end;and a second end in a substrate;

a second diffused bit line that is continuous between a first end and a second end in the substrate;

a diffused source line in the substrate;

a first plurality of memory cells formed in an on the substrate, wherein portions of the first diffused bit line and the diffused source line form drain/source regions of the memory cells;

a second plurality of memory cells formed in and on the substrate, wherein portions of the second diffused bit line and the diffused source line form drain/source regions of the memory cells in the second plurality;

a first bank select device that when activated, conducts a current that enters the first end of the first diffused bit line;

a second bank select device that when activated, conducts a current that enters the second end of the first diffused bit line;

a third bank select device that when activated, conducts a current that enters the first end of the second diffused bit line;

a fourth bank select device that when activated, conducts a current that enters the second end of the second diffused bit line;

a first contact connecting the bit line to the first and third bank select devices; and a second contact connecting the bit line to the second and fourth bank select devices.

15. The integrated circuit of claim 14, wherein:

the first and second bank select devices are connected for simultaneous activation during an access of one of the first plurality of memory cells; and the third and fourth bank select devices are connected for simultaneous activation during an access of one of the second plurality of memory cells.

16. The integrated circuit of claim 15, wherein:

during the access of one of the first plurality of memory cells, the third and fourth bank select devices are deactivated; and during the access of one of the second plurality of memory cells, the first and second bank select devices are deactivated.

17. The integrated circuit of claim 14, wherein the bank further comprises:

a first contact to a first end of the diffused source line; and second contact to a second end of the diffused source line, wherein the diffused source line is continuous in the substrate between the first and second ends of the diffused source line.

18. The integrated circuit of claim 17, further comprising a virtual ground structure, wherein the first and second contacts electrically connect the diffused source line to the virtual ground structure.

19. The integrated circuit of claim 14, wherein the bank further comprises a contact to the diffused source line, the contact being in a central portion of the diffused source line.

20. The integrated circuit of claim 19, further comprising a virtual ground structure, wherein the contact electrically connects the diffused source line to the virtual ground structure.

21. A programming method for a memory cell in a contactless Flash memory, the method comprising:

activating a word line associated with the memory cell to enable a current flow through the memory cell from a diffused bit line to a diffused source line; and simultaneously generating a first programming current that flows in a first direction along the diffused bit line to the memory cell and a second programming current that flows in a second direction along the diffused bit line to the memory cell, the second direction being opposite the first direction.

22. The method of claim 21, further comprising biasing an overlying bit line to programming voltage, wherein simultaneously generating the first and second programming currents comprises simultaneously activating a first bank select device that is between the overlying bit line and a first end of the diffused bit line and a second bank select device that is between the overlying bit line and a second end of the diffused bit line.

23. The method of claim 21, further comprising connecting both ends of the diffused source line to ground so that current flows in the diffused source line in both directions away from the memory cell.

24. The method of claim 21, further comprising connecting a midpoint of the diffused source line to ground, wherein the midpoint of the diffused source line is approximately equidistant from the first and second ends of the diffused bit line.

25. A method for reading a memory cell in a contactless Flash memory, the method comprising:

activating a word line associated with the memory cell to a level that enables a current flow through the memory cell from a diffused bit line to a diffused source line if the memory cell is in a first threshold voltage state but does not enable current flow if the memory cell is in a second threshold voltage state; and connecting a metal bit line to a first end and a second end of a diffused bit line associated with the memory cell;

grounding the diffused source line; and sensing whether a current flows through the metal bit line.

26. The method of claim 25, wherein grounding the diffused source line comprises connecting the diffused source line to a virtual ground line via a contact at a midpoint of the diffused source line.

27. The method of claim 25, wherein grounding the diffused source line comprises connecting opposite ends of the diffused source line to ground.

* * * * *